(12) United States Patent
Zhang et al.

(10) Patent No.: US 9,448,445 B2
(45) Date of Patent: Sep. 20, 2016

(54) ELECTRODE STRUCTURE AND MANUFACTURING METHOD THEREOF, ARRAY SUBSTRATE AND MANUFACTURING METHOD THEREOF, AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Min Zhang, Beijing (CN); Minsu Kim, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/429,971

(22) PCT Filed: May 27, 2014

(86) PCT No.: PCT/CN2014/078534
§ 371 (c)(1),
(2) Date: Mar. 20, 2015

(87) PCT Pub. No.: WO2015/081672
PCT Pub. Date: Jun. 11, 2015

(65) Prior Publication Data
US 2016/0041433 A1    Feb. 11, 2016

(30) Foreign Application Priority Data

Dec. 6, 2013  (CN) .......................... 2013 1 0651938

(51) Int. Cl.
*G02F 1/1343*       (2006.01)
*G02F 1/1362*       (2006.01)
(Continued)

(52) U.S. Cl.
CPC ....... *G02F 1/134309* (2013.01); *G02F 1/1343* (2013.01); *G02F 1/1362* (2013.01);
(Continued)

(58) Field of Classification Search
CPC .................. G02F 1/134309; G02F 1/136288; G02F 1/136227; G02F 1/1362; G02F 1/1368; G02F 1/1343; H01L 27/124; H01L 21/77; H01L 29/786
USPC ................ 257/48, 59, 72, 89, 350, E33.053, 257/E29.278, E27.111, E21.413, E21.414; 438/29, 30, 34; 349/43
See application file for complete search history.

(56) References Cited

U.S. PATENT DOCUMENTS 6,960,786 B2 * 11/2005 Yamazaki ........... H01L 27/3244
                                                      257/448
2003/0197178 A1 * 10/2003 Yamazaki ......... G02F 1/136227
                                                      257/59
(Continued)

FOREIGN PATENT DOCUMENTS

| CN | 101127357 A | 2/2008 |
| CN | 202948926 U | 5/2013 |
| CN | 103676354 A | 3/2014 |

OTHER PUBLICATIONS

Search Report issued in International Application No. PCT/CN2014/078534 dated May 27, 2014.
(Continued)

*Primary Examiner* — Dao H Nguyen
(74) *Attorney, Agent, or Firm* — Nath, Goldberg & Meyer; Joshua B. Goldberg (57) ABSTRACT

An electrode structure comprises an introduction electrode and a body electrode, and a first isolating layer and a second isolating layer arranged between the introduction electrode and the body electrode. A first via hole is formed in the first isolating layer, a second via hole is formed in the second isolating layer. The hole axes of the first via hole and the second via hole are on the same straight line passing through the body electrode, so that a part of the body electrode is exposed via the first and the second via holes. The introduction electrode is electrically connected with the body electrode through the part of the body electrode. The diameter of the first via hole is smaller than that of the second via hole, and the first isolating layer extends to completely cover the hole wall of the second via hole.

22 Claims, 2 Drawing Sheets

(51) Int. Cl.
  *H01L 27/12*    (2006.01)
  *H01L 29/786*   (2006.01)
  *G02F 1/1368*   (2006.01)
  *H01L 21/77*    (2006.01)

(52) U.S. Cl.
  CPC ....... *G02F1/1368* (2013.01); *G02F 1/136227* (2013.01); *G02F 1/136286* (2013.01); *H01L 21/77* (2013.01); *H01L 27/124* (2013.01); *H01L 29/786* (2013.01); *H01L 2924/0002* (2013.01)

(56) References Cited

U.S. PATENT DOCUMENTS

2004/0266041 A1* 12/2004 Kim .................. G02F 1/13458
                                                        438/30
2012/0105778 A1   5/2012 Fujiyoshi et al.
2012/0182490 A1*  7/2012 Kim .................. G02F 1/134363
                                                        349/43
2013/0306972 A1* 11/2013 Ryu ..................... H01L 29/786
                                                        257/59

OTHER PUBLICATIONS

1st office action issued in Chinese application No. 201310651938.5 dated Sep. 15, 2015.

Form PCT/ISA/237 issued in International application No. PCT/CN2014/078534.

* cited by examiner

ELECTRODE STRUCTURE AND MANUFACTURING METHOD THEREOF, ARRAY SUBSTRATE AND MANUFACTURING METHOD THEREOF, AND DISPLAY DEVICE

This is a National Phase Application filed under 35 U.S.C. 371 as a national stage of PCT/CN2014/078534, filed May 27, 2014, an application claiming the benefit to Chinese application No. 201310651938.5 filed on Dec. 6, 2013; the content of each of which is hereby incorporated by reference in its entirety.

FIELD OF THE INVENTION

The present invention belongs to the field of display technology, and in particular relates to an electrode structure and a manufacturing method thereof, an array substrate and a manufacturing method thereof, and a display device.

BACKGROUND OF THE INVENTION

Liquid crystal displays (LCDs) have become mainstream products in present flat panel displays due to the characteristics of small size, low power consumption, no radiation and the like. At present, with wide application of high-resolution and small-sized liquid crystal displays, liquid crystal displays with low power consumption have become a general trend.

An array substrate is an important part of a liquid crystal display, and is also a key component for displaying. With the development of technology, people try to make many improvements on the array substrate to reduce the power consumption of the liquid crystal display.

Figure 1:
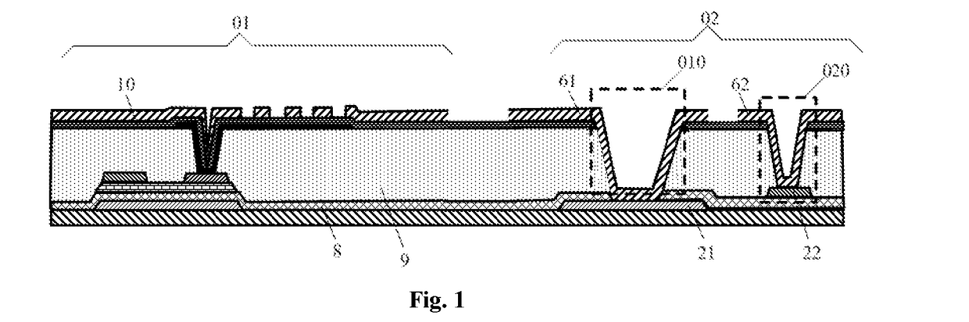
FIG. 1 is a structural schematic diagram of an array substrate in the prior art.

For example, with respect to an array substrate of a liquid crystal display of a High Advanced Super Dimension Switch (HADS) mode, as shown in FIG. 1, a common electrode is arranged above a data line, and the common electrode and the data line have mutually superposed parts on the spatial position, so that a capacitor is formed between the common electrode and the data line in the array substrate during displaying. The higher the capacitance of the capacitor is, the higher the power consumption of the array substrate is. Generally, an organic insulating layer is additionally arranged between the common electrode and the data line of the array substrate to reduce the power consumption of the array substrate and even the whole display. The organic insulating layer enables the distance between the common electrode and the data line to be increased and the capacitance between the common electrode and the data line to be reduced, so that the power consumption of the array substrate is reduced.

Generally, signal test is needed after the array substrate is manufactured. A signal test structure is generally formed in a non-display area of the array substrate, and is manufactured together with a display structure in a display area of the array substrate. Part of the layer structure in the display area also extends to the non-display area, e.g. an organic insulating layer, a gate insulating layer, a passivation layer and the like, so that additional process steps are not added during manufacturing, and the mismatch gap between the non-display area and the display area may be reduced so that signal exchanging between the non-display area and the display area is facilitated.

Generally, the signal test includes gate line signal test and data line signal test, namely a gate line test signal is applied to a gate line and a data line test signal is applied to a data line through the test structure to detect whether the array substrate operates normally. In the prior art, as shown in FIG. 1, the gate line test signal is applied via a gate line signal input electrode 21 arranged in a non-display area 02, and the data line test signal is applied via a data line signal input electrode 22 arranged in the non-display area 02. The gate line signal input electrode 21 is arranged on the same layer as the gate line, a gate insulating layer 8, an organic insulating layer 9 and a passivation layer 10 which extend from a display area 01 are sequentially arranged above the gate line signal input electrode 21, and a first introduction electrode 61 is formed on the passivation layer 10 and is electrically connected with the gate line signal input electrode 21 via a via hole I 010 penetrating through the gate insulating layer 8, the organic insulating layer 9 and the passivation layer 10; and the data line signal input electrode 22 is arranged on the same layer as the data line, the organic insulating layer 9 and the passivation layer 10 which extend from the display area 01 are sequentially arranged above the data line signal input electrode 22, and a second introduction electrode 62 is formed on the passivation layer 10 and is electrically connected with the data line signal input electrode 22 via a via hole II 020 penetrating through the organic insulating layer 9 and the passivation layer 10, wherein the first introduction electrode 61 and the second introduction electrode 62 are used for introducing the test signals to the gate line signal input electrode 21 and the data line signal input electrode 22 respectively.

Figure 2:
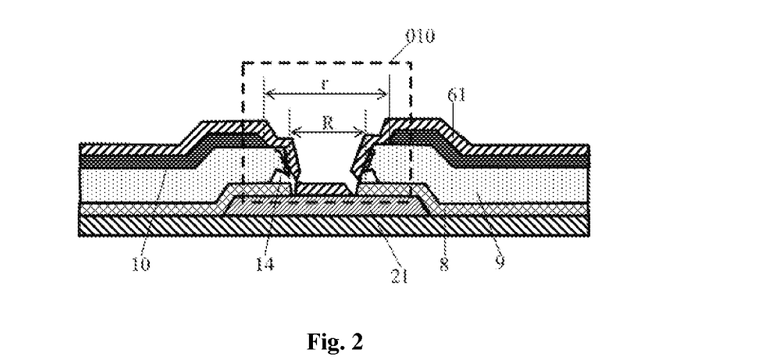
FIG. 2 is a structural schematic diagram indicating that a gate line signal test part in FIG. 1 has a defect.

In the manufacturing process of the above-mentioned array substrate, as shown in FIG. 2, for example, when the via hole I 010 correspondingly located above the gate line signal input electrode 21 is formed, an organic insulating layer via hole is formed in the organic insulating layer 9; and then a passivation layer via hole is formed in the passivation layer 10 and a gate insulating layer via hole is formed in the gate insulating layer 8 at the same time by one dry etching process. Because the aperture diameter (namely the aperture diameter r of the via hole in the passivation layer 10), corresponding to the exposed and developed part of a via hole to be formed, of the passivation layer 10 is greater than the aperture diameter R of the organic insulating layer via hole, when patterns of the passivation layer via hole and the gate insulating layer via hole are formed by one dry etching process, the hole wall of the organic insulating layer via hole is easily partially etched off again to form a gap 14 in the organic insulating layer via hole shown in FIG. 2. As a result, in the subsequent manufacturing process of the first introduction electrode 61, when extending to the organic insulating layer via hole, the first introduction electrode 61 is virtually connected with or disconnected from the gate line signal input electrode 21, then the test signals cannot be input, and normal test of the array substrate cannot be realized.

SUMMARY OF THE INVENTION

In view of the above-mentioned technical problems in the prior art, the present invention provides an electrode structure and a manufacturing method thereof, an array substrate and a manufacturing method thereof, and a display device. According to the electrode structure, a first isolating layer completely covers a hole wall of a second via hole in a second isolating layer, so that the hole wall of the second via hole in the second isolating layer will not be damaged, thus it is ensured that an introduction electrode can be electrically connected with a body electrode effectively, and that signals can be introduced normally.

The present invention provides an electrode structure, including an introduction electrode and a body electrode, wherein a first isolating layer and a second isolating layer are arranged between the introduction electrode and the body electrode, a first via hole is formed in the first isolating layer, a second via hole is formed in the second isolating layer, and the hole axis of the first via hole and the hole axis of the second via hole are on a same straight line passing through the body electrode, so that a part of the body electrode is exposed via the first via hole and the second via hole; the introduction electrode is electrically connected with the body electrode through the part of the body electrode exposed via the first via hole and the second via hole, wherein the diameter of the first via hole is smaller than that of the second via hole; and the first isolating layer extends so as to completely cover the hole wall of the second via hole.

Preferably, a third isolating layer is arranged between the body electrode and the second isolating layer, a third via hole is formed in the third isolating layer, the hole axis of the third via hole and the hole axis of the second via hole are on the same straight line, and the diameter of the third via hole is smaller than or equal to that of the first via hole, so that the part of the body electrode is also exposed via the third via hole, and the first isolating layer also extends so as to cover the upper surface, exposed via the second via hole, of the third isolating layer.

Preferably, the second isolating layer is formed by adopting a polyimide epoxy resin material, the first isolating layer and the third isolating layer are formed by adopting a silicon nitride material, and the introduction electrode is formed by adopting an indium tin oxide or indium-doped zinc oxide material.

The present invention further provides an array substrate, including a base substrate and a plurality of electrode structures arranged on the base substrate, and containing a display area and a non-display area, wherein the electrode structures are the above-mentioned ones, and are arranged in the display area and/or the non-display area.

Preferably, the array substrate further includes a plurality of gate lines and data lines crossed to each other, the gate lines and the data lines divide the display area into a plurality of pixel regions, and a thin film transistor is arranged in each pixel region and includes a gate, a gate insulating layer, a source and a drain, wherein the gate is electrically connected with one of the gate lines, the source is electrically connected with one of the data lines, an organic insulating layer and a passivation layer are arranged above the thin film transistor, a common electrode is arranged above the passivation layer, and the gate insulating layer, the organic insulating layer and the passivation layer simultaneously extend to the non-display area.

Preferably, the electrode structures arranged in the non-display area include a first electrode structure and a second electrode structure, the gate line is electrically connected with the body electrode in the first electrode structure, the passivation layer extending to the non-display area is used as the first isolating layer in the first electrode structure, the organic insulating layer extending to the non-display area is used as the second isolating layer in the first electrode structure, the gate insulating layer extending to the non-display area is used as the third isolating layer in the first electrode structure, and the introduction electrode in the first electrode structure is used for introducing a gate line test signal; and/or, the data line is electrically connected with the body electrode in the second electrode structure, the passivation layer extending to the non-display area is used as the first isolating layer in the second electrode structure, the organic insulating layer extending to the non-display area is used as the second isolating layer in the second electrode structure, and the introduction electrode in the second electrode structure is used for introducing a data line test signal.

Preferably, the electrode structures arranged in the display area are used as a third electrode structure, a common electrode line is arranged on the base substrate and is used as the body electrode in the third electrode structure, the passivation layer is used as the first isolating layer in the third electrode structure, the organic insulating layer is used as the second isolating layer in the third electrode structure, the gate insulating layer is used as the third isolating layer in the third electrode structure, the common electrode is used as the introduction electrode in the third electrode structure, and the introduction electrode is used for introducing a common reference voltage.

The present invention further provides a display device, including the above-mentioned array substrate.

The present invention further provides a manufacturing method of an electrode structure, including the following steps:

forming a body electrode on a first base substrate by a patterning process;

forming a second isolating layer on the first base substrate where the body electrode is formed, and forming a second via hole at a position corresponding to the body electrode in the second isolating layer by a patterning process;

forming a first isolating layer on the first base substrate where the body electrode and the second isolating layer are formed, and forming a first via hole in the first isolating layer by a patterning process, wherein the hole axis of the first via hole and the hole axis of the second via hole are on the same straight line, the diameter of the first via hole is smaller than that of the second via hole, so that a part of the body electrode is exposed via the first via hole and the second via hole, and the first isolating layer completely covers the hole wall of the second via hole; and forming an introduction electrode on the first base substrate where the body electrode, the second isolating layer and the first isolating layer are formed, wherein the introduction electrode is electrically connected with the body electrode through the part of the body electrode exposed via the first via hole and the second via hole.

Preferably, before the step of forming the second isolating layer, a third isolating layer is formed on the first base substrate where the body electrode is formed; and the step of forming the first via hole in the first isolating layer by the patterning process further includes: forming a third via hole in the third isolating layer by the same patterning process as forming the first via hole, wherein the diameter of the third via hole is smaller than or equal to that of the first via hole, so that the part of the body electrode is also exposed via the third via hole, and the first isolating layer also completely covers the upper surface, exposed via the second via hole, of the third isolating layer.

The present invention further provides a manufacturing method of an array substrate, wherein the array substrate includes a display area and a non-display area, and a plurality of electrode structures are formed in the display area and/or the non-display area by adopting the above-mentioned manufacturing method of the electrode structure.

Preferably, the method includes, in the display area, forming a gate and a gate line;

forming a gate insulating layer;

forming a source/drain metal layer which includes a source, a drain and a data line;

forming an organic insulating layer and a passivation layer; and forming a common electrode, wherein the gate insulating layer, the organic insulating layer and the passivation layer simultaneously extend to the non-display area.

Preferably, the electrode structures formed in the non-display area include a first electrode structure and a second electrode structure, wherein the body electrode in the first electrode structure is electrically connected with the gate line, the passivation layer extending to the non-display area is used as the first isolating layer in the first electrode structure, the organic insulating layer extending to the non-display area is used as the second isolating layer in the first electrode structure, the gate insulating layer extending to the non-display area is used as the third isolating layer in the first electrode structure, and the introduction electrode in the first electrode structure is used for introducing a gate line test signal; and/or, the body electrode in the second electrode structure is electrically connected with the data line, the passivation layer extending to the non-display area is used as the first isolating layer in the second electrode structure, the organic insulating layer extending to the non-display area is used as the second isolating layer in the second electrode structure, and the introduction electrode in the second electrode structure is used for introducing a data line test signal.

Preferably, the gate line and the body electrode in the first electrode structure are formed by adopting a same material in a same patterning process, and/or, the data line and the body electrode in the second electrode structure are formed by adopting a same material in a same patterning process.

Preferably, the electrode structure formed in the display area are used as a third electrode structure, a common electrode line is also formed in the display area and is used as the body electrode in the third electrode structure, the passivation layer is used as the first isolating layer in the third electrode structure, the organic insulating layer is used as the second isolating layer in the third electrode structure, the gate insulating layer is used as the third isolating layer in the third electrode structure, and the common electrode is used as the introduction electrode in the third electrode structure to introduce a common reference voltage.

Preferably, the common electrode line and the gate are formed by adopting a same material in a same patterning process; and the introduction electrode in the third electrode structure and the common electrode are formed by adopting a same material in a same patterning process.

The present invention has the beneficial effects that: according to the electrode structure provided by the present invention, the first isolating layer completely covers the hole wall of the second via hole in the second isolating layer, so that the hole wall of the second via hole in the second isolating layer may not be damaged, thus it is ensured that the introduction electrode can be electrically connected with the body electrode effectively, and that signals can be introduced normally. The array substrate adopting the electrode structure may normally introduce test signals and display signals via the electrode structure, so that the array substrate can be subjected to normal test and perform normal display. Thus the test stability of the array substrate is improved, and the displaying effect of the array substrate is also improved. The display device adopting the array substrate of the present invention can be subjected to normal test, and the displaying effect of the display device may be improved.

REFERENCE NUMERALS IN THE FIGURES 1, first base substrate; 2, body electrode; 21, gate line signal input electrode; 22, data line signal input electrode; 3, third isolating layer; 31, third via hole; 4, second isolating layer; 41, second via hole; 5, first isolating layer; 51, first via hole; 6, introduction electrode; 61, first introduction electrode; 62, second introduction electrode; 7, thin film transistor; 71, gate; 72, source; 73, drain; 74, active layer; 8, gate insulating layer; 9, organic insulating layer; 10, passivation layer; 11, base substrate; 12, common electrode; 13, common electrode line; 14, gap; 01, display area; 02, non-display area; 001, first electrode structure; 002, second electrode structure; 003, electrode structure; 010, via hole I; 020, via hole II.

DETAILED DESCRIPTION OF THE EMBODIMENTS

To make those skilled in the art better understand the technical solutions of the present invention, an electrode structure and a manufacturing method thereof, an array substrate and a manufacturing method thereof, and a display device of the present invention will be further described in detail below in combination with the accompanying drawings and specific embodiments.

In the present invention, a patterning process includes a photoetching process and auxiliary processes of printing, ink jetting and the like, wherein the photoetching process indicates a process of forming a predetermined pattern via exposure, development, etching and the like by using a photoresist, a mask, an exposure machine and the like.

Figure 3:
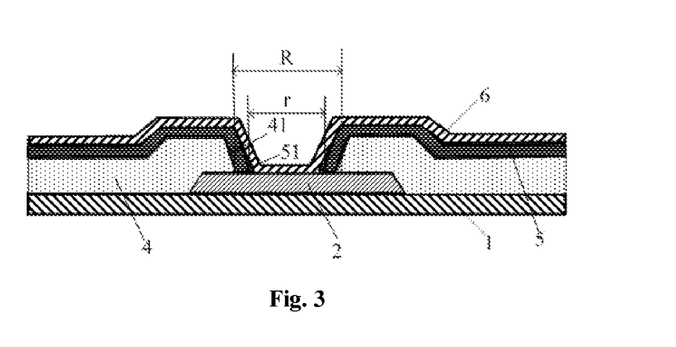
FIG. 3 is a structural schematic diagram of an electrode structure in embodiment 1 of the present invention.

Embodiment 1:

This embodiment provides an electrode structure, as shown in FIG. 3, including an introduction electrode 6 and a body electrode 2. The body electrode 2 is arranged on a first base substrate 1, a first isolating layer 5 and a second isolating layer 4 are arranged between the introduction electrode 6 and the body electrode 2, a first via hole 51 is formed in the first isolating layer 5, and a second via hole 41 is formed in the second isolating layer 4. The hole axis of the first via hole 51 and the hole axis of the second via hole 41 are on the same straight line passing through the body electrode 2, so that a part of the body electrode 2 is exposed via the first via hole 51 and the second via hole 41. The introduction electrode 6 is electrically connected with the body electrode 2 via the part of the body electrode 2 exposed by the first via hole 51 and the second via hole 41. A diameter of the first via hole 51 is smaller than that of the second via hole 41, and the first isolating layer 5 extends to cover a hole wall of the second via hole 41.

The second isolating layer 4 may be formed by adopting a polyimide epoxy resin material, the first isolating layer 5 may be formed by adopting a silicon nitride material, and the introduction electrode 6 may be formed by adopting an indium tin oxide or indium-doped zinc oxide material.

This embodiment further provides a manufacturing method of the electrode structure, including the following specific steps.

Step S1: a body electrode 2 is formed on a first base substrate 1 by a patterning process.

Step S2: a second isolating layer 4 is formed on the first base substrate 1 where step S1 is completed. Specifically, the first base substrate 1 is coated with the second isolating layer 4, and a second via hole 41 is formed in correspondence to the body electrode 2 in the second isolating layer 4 by one patterning process to expose a circular part with the diameter of R in the upper surface of the body electrode 2.

In this step, the second via hole 41 is exposed by adopting a mask, a corresponding pattern for forming the second via hole 41 on the mask is circular, and the diameter of the pattern is R. Correspondingly, the diameter of the formed second via hole 41 is also R.

Step S3: a first isolating layer 5 is formed on the first base substrate 1 where step S2 is completed. Specifically, the first base substrate 1 is coated with the first isolating layer 5, and a first via hole 51 is formed in the first isolating layer 5 by one patterning process, wherein the hole axis of the first via hole 51 and the hole axis of the second via hole 41 are on the same straight line.

In this step, the first via hole 51 is exposed by adopting a mask, a corresponding pattern for forming the first via hole 51 on the mask is circular, and the diameter of the pattern is r (r<R). Correspondingly, the diameter of the formed first via hole 51 is also r. That is, the first via hole 51 is formed in such a way that the first isolating layer 5 covers the hole wall of the second via hole 41 and simultaneously exposes a circular part with the diameter of r in the upper surface of the body electrode 2.

Step S4: an introduction electrode 6 is formed on the first base substrate 1 where step S3 is completed, wherein the introduction electrode 6 is electrically connected with the body electrode 2 through the upper surface of the part of the body electrode 2 exposed via the first via hole 51 and the second via hole 41.

So far, the electrode structure in this embodiment is manufactured.

As r<R, when the first via hole 51 is formed by etching the first isolating layer 5, a part of the first isolating layer 5 which clings to the hole wall of the second via hole 41 and has a thickness of R-r is not etched off in the second via hole 41 by adjusting the corresponding size of the mask, and the part of the first isolating layer 5 completely covers the hole wall of the second via hole 41, so the hole wall of the second via hole 41 formed in the second isolating layer 4 is not damaged by etching, then the introduction electrode 6 can be in good contact with the body electrode 2, virtual connection or disconnection between the introduction electrode 6 and the body electrode 2 is avoided, and the introduction electrode 6 can normally introduce electrical signals to the body electrode 2.

Figure 4:
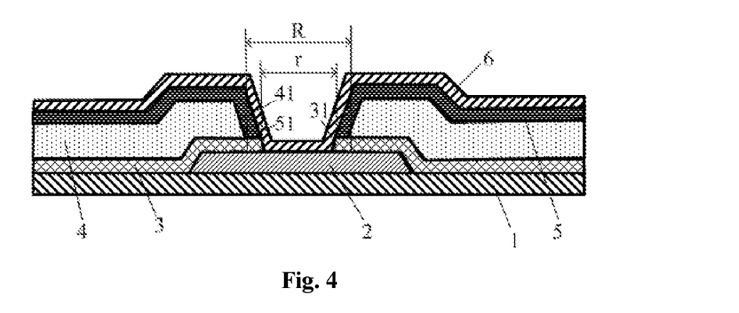
FIG. 4 is a structural schematic diagram of an electrode structure in embodiment 2 of the present invention.

Embodiment 2:

This embodiment provides an electrode structure. As shown in FIG. 4, this embodiment differs from embodiment 1 in that, on the basis of embodiment 1, in the electrode structure of this embodiment, a third isolating layer 3 is arranged between the body electrode 2 and the second isolating layer 4. A third via hole 31 is formed in the third isolating layer 3, the hole axis of the third via hole 31 and the hole axis of the second via hole 41 are on the same straight line, and the diameter of the third via hole 31 is smaller than or equal to the diameter R of the first via hole 51, so that the part of the body electrode 2 is also exposed via the third via hole 31, and the first isolating layer 5 also extends to cover the upper surface, exposed by the second via hole 41, of the third isolating layer 3.

The third isolating layer 3 is formed by adopting a silicon nitride material. On the basis of the manufacturing steps of the electrode structure in embodiment 1, the manufacturing steps of the electrode structure in this embodiment further include:

step S1' between step S1 and step S2: depositing or applying the third isolating layer 3 on the first base substrate 1 where step S1 is completed.

Step S3 further includes: forming the third via hole 31 in the third isolating layer 3 by the same one patterning process while forming the first via hole 51 in the first isolating layer 5.

In this step, the first via hole 51 and the third via hole 31 are formed in one etching process. That is, after the first via hole 51 is exposed by adopting a mask, the first via hole 51 and the third via hole 31 are simultaneously formed by one etching process. Therefore, the diameters of the first via hole 51 and the third via hole 31 are identical, i.e. they are both r.

It should be noted herein that, generally the diameter of the third via hole 31 is slightly smaller than that of the first via hole 51 due to the operation reason in the practical manufacturing process.

Other manufacturing steps of the electrode structure in this embodiment are the same as those in embodiment 1, and are not repeated herein.

As r<R, and the first isolating layer 5 extends to cover the upper surface, exposed by the second via hole 41, of the third isolating layer 3, when the first via hole 51 and the third via hole 31 are simultaneously formed by one etching of the first isolating layer 5 and the third isolating layer 3, similarly, a part of the first isolating layer 5 which clings to the hole wall of the second via hole 41 and has a thickness of R-r is not etched off in the second via hole 41 by adjusting the corresponding size of the mask, and the part of the first isolating layer 5 completely covers the hole wall of the second via hole 41, so the hole wall of the second via hole 41 formed in the second isolating layer 4 is not damaged by etching, the introduction electrode 6 may be in good contact with the body electrode 2, virtual connection or disconnection between the introduction electrode 6 and the body electrode 2 is avoided, and the introduction electrode 6 may normally introduce electrical signals to the body electrode 2.

Figure 5:
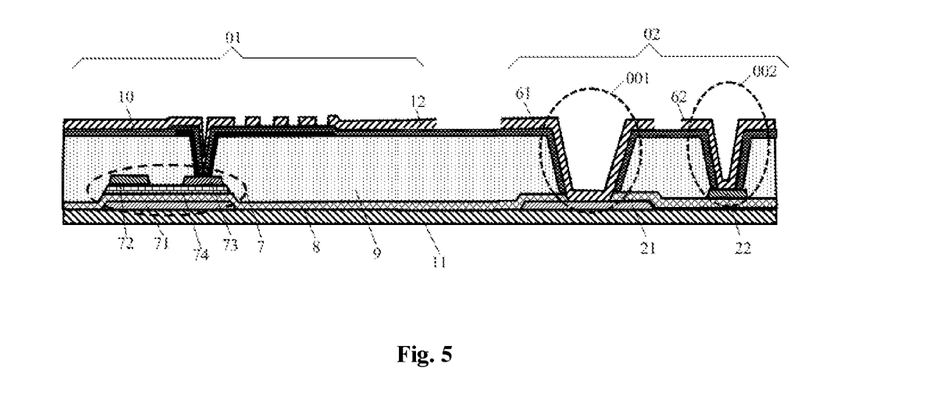
FIG. 5 is a structural schematic diagram of an array substrate in embodiment 3 of the present invention.

Embodiment 3:

This embodiment provides an array substrate, as shown in FIG. 5, including a base substrate 11 and a plurality of electrode structures arranged on the base substrate 11. The array substrate includes a display area 01 and a non-display area 02, wherein the plurality of electrode structures arranged in the non-display area 02 are the electrode structures of embodiments 1 and 2 respectively.

In the array substrate, a plurality of gate lines and data lines crossed to each other (not shown in FIG. 5) divide the display area 01 into a plurality of pixel regions, and a thin film transistor 7 is arranged in each pixel region and includes a gate 71, a gate insulating layer 8, an active layer 74, a source 72 and a drain 73. The gate insulating layer 8 is arranged between the gate 71 and the source 72 to isolate the gate 71 from the source 72. The gate 71 is electrically connected with one of the gate lines and arranged in the same layer as the gate line, the source 72 is electrically connected with one of the data lines and arranged in the same layer as the data line, an organic insulating layer 9 and a passivation layer 10 are arranged above the thin film transistor 7, and a common electrode 12 is arranged above the passivation layer 10. The gate insulating layer 8, the organic insulating layer 9 and the passivation layer 10 simultaneously extend to the non-display area 02.

In this embodiment, the electrode structures arranged in the non-display area 02 include a first electrode structure 001 and a second electrode structure 002, wherein the first electrode structure 001 is the one in embodiment 2, and the second electrode structure 002 is the one in embodiment 1. The gate line is electrically connected with the body electrode (namely the gate line signal input electrode 21) in the first electrode structure 001, the passivation layer 10 extends to the non-display area 02 and is used as the first isolating layer in the first electrode structure 001, the organic insulating layer 9 extends to the non-display area 02 and is used as the second isolating layer in the first electrode structure 001, the gate insulating layer 8 extends to the non-display area 02 and is used as the third isolating layer in the first electrode structure 001, and the introduction electrode (namely the first introduction electrode 61) is used for introducing a gate line test signal. The data line is electrically connected with the body electrode (namely the data line signal input electrode 22) in the second electrode structure 002, the passivation layer 10 extends to the non-display area 02 and is used as the first isolating layer in the second electrode structure 002, the organic insulating layer 9 extends to the non-display area 02 and is used as the second isolating layer in the second electrode structure 002, and the introduction electrode (namely the second introduction electrode 62) is used for introducing a data line test signal.

In this case, the body electrode (namely the gate line signal input electrode 21) in the first electrode structure 001 and the gate 71 in the display area 01 are formed by adopting the same material in the same patterning process, namely the body electrode in the first electrode structure 001, the gate 71 in the display area 01 and the gate line are formed in the same layer of the array substrate. The base substrate 11 of the array substrate in this embodiment is equivalent to the first base substrate 1 of the electrode structure in embodiment 2 shown in FIG. 4. The body electrode (namely the data line signal input electrode 22) in the second electrode structure 002 and the source 72 in the display area 01 are formed by adopting the same material in the same patterning process, namely the body electrode in the second electrode structure 002, the source 72 in the display area 01 and the data line are formed in the same layer of the array substrate. The base substrate 11 provided with the gate insulating layer 8 in the array substrate of this embodiment is equivalent to the first base substrate 1 of the electrode structure in embodiment 1 shown in FIG. 3. The introduction electrode (namely the first introduction electrode 61) of the first electrode structure 001, the introduction electrode (namely the second introduction electrode 62) of the second electrode structure 002 and the common electrode 12 in the display area 01 are formed by adopting the same material in the same patterning process, namely the introduction electrode in the first electrode structure 001, the introduction electrode in the second electrode structure 002 and the common electrode 12 are formed in the same layer of the array substrate.

With such configuration, the first electrode structure 001 and the second electrode structure 002 which are arranged in the non-display area 02 of the array substrate can be manufactured together with the display structures (such as the thin film transistor 7, the gate line and the data line) in the display area 01 of the array substrate, so that additional process steps are not added, reduction of the mismatch gap between the non-display area 02 and the display area 01 is facilitated, and signal exchanging between the non-display area 02 and the display area 01 is facilitated.

It should be noted that, although the first introduction electrode 61 of the first electrode structure 001, the second introduction electrode 62 of the second electrode structure 002 and the common electrode 12 are formed in the same layer of the array substrate, any two of them are not connected with each other, namely electrically isolated from each other. That is because the common electrode 12 is used for inputting a common reference voltage signal during displaying, the first introduction electrode 61 of the first electrode structure 001 is used for inputting a gate line test signal during testing, and the second introduction electrode 62 of the second electrode structure 002 is used for inputting a data line test signal during testing. The common voltage signal during displaying and the gate line test signal and the data line test signal during testing are respectively independently provided and do not interfere with one another.

In this embodiment, there are a plurality of first electrode structures 001 and a plurality of second electrode structures 002, and the plurality of first electrode structures 001 or the plurality of second electrode structures 002 are arranged at certain intervals. Each first electrode structure 001 corresponds to a gate line, and the introduction electrodes (namely the first introduction electrodes 61) of the plurality of first electrode structures 001 are electrically connected with each other. Such configuration is favorable for introducing a gate line test signal, namely as long as the gate line test signal is input to the first introduction electrode 61 of one first electrode structure 001, the body electrodes (namely the gate line signal input electrodes 21) in all the first electrode structures 001 can acquire the gate line test signal through the first introduction electrodes 61 connected with each other, so the gate line test signal does not need to be input to each first electrode structure 001. Each second electrode structure 002 corresponds to a data line, and the introduction electrodes (namely the second introduction electrodes 62) of the plurality of second electrode structures 002 are electrically connected with each other. Such configuration is also favorable for introducing a data line test signal, namely as long as the data line test signal is input to the second introduction electrode 62 of one second electrode structure 002, the body electrodes (namely the data line signal input electrodes 22) in all the second electrode structures 002 can acquire the data line test signal through the second introduction electrodes 62 connected with each other, so the data line test signal does not need to be input to each second electrode structure 002.

It should be noted that, FIG. 5 is merely a schematic structural diagram of the array substrate in this embodiment. The cross sections of the thin film transistor 7, the first electrode structure 001 and the second electrode structure 002 of a practical array substrate cannot be simultaneously shown on one section plane. In FIG. 5, the several structures are just schematically put into a diagram for description, so as to describe their structural relation more clearly.

This embodiment further provides a manufacturing method of the above-mentioned array substrate, including a step of forming a first electrode structure 001 and a second electrode structure 002 in a non-display area 02 by using the manufacturing method of the electrode structure in embodiment 1 or 2.

The method further includes: forming a gate 71 and a gate line in a display area 01; forming a gate insulating layer 8, and extending the gate insulating layer 8 to the non-display area 02 to serve as a third isolating layer of the first electrode structure 001; forming a source/drain metal layer which includes a source 72, a drain 73 and a data line, and forming an active layer 74; forming an organic insulating layer 9 and a passivation layer 10, and extending the organic insulating layer 9 and the passivation layer 10 to the non-display area 02 to respectively serve as the second isolating layer and the first isolating layer of the first electrode structure 001 and the second electrode structure 002; and forming a common electrode 12.

In this case, the body electrode (namely the gate line signal input electrode 21) in the first electrode structure 001 and the gate 71 are formed by adopting the same material in the same patterning process; and the body electrode (namely the data line signal input electrode 22) in the second electrode structure 002 and the source 72 are formed by adopting the same material in the same patterning process.

The gate line is electrically connected with the body electrode in the first electrode structure 001, and the data line is electrically connected with the body electrode in the second electrode structure 002.

In this embodiment, the manufacturing steps of the first electrode structure 001 are the ones of the electrode structure in embodiment 2, and the manufacturing steps of the second electrode structure 002 are the ones of the electrode structure in embodiment 1.

In this embodiment, when the array substrate needs to be tested, a gate line test signal is input to the introduction electrode (namely the first introduction electrode 61) of the first electrode structure 001, a data line test signal is input to the introduction electrode (namely the second introduction electrode 62) of the second electrode structure 002, and then the whole array substrate can be tested, so that the defect of the tested array substrate is discovered.

Although a case that the first electrode structure formed by adopting the method in embodiment 2 and the second electrode structure formed by adopting the method in embodiment 1 exist in the non-display area is taken as an example in the above-mentioned description of this embodiment, it should be understood that, for the array substrate of this embodiment, the electrode structures arranged in the non-display area may also only include one of the first electrode structure and the second electrode structure.

The array substrate in this embodiment is provided with the first electrode structure, so that when via holes are formed in the passivation layer and the gate insulating layer by one etching process, the hole wall of the via hole which has been formed in the organic insulating layer will not be damaged by etching, and/or the array substrate is provided with the second electrode structure, so that when a via hole is formed by etching the passivation layer, the hole wall of the via hole which has been formed in the organic insulating layer will not be damaged by etching. Thus, the first electrode structure and/or the second electrode structure arranged in the non-display area can normally introduce test signals to test the array substrate, and the test stability is improved.

Figure 6:
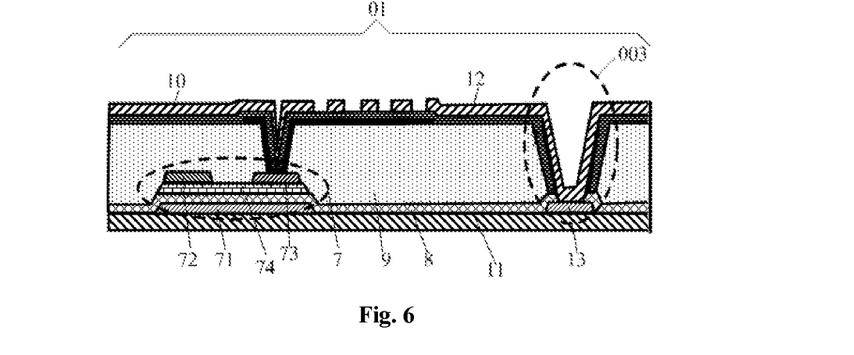
FIG. 6 is a structural schematic diagram of an array substrate in embodiment 5 of the present invention.

Embodiment 4:

This embodiment provides an array substrate, which differs from embodiment 3 in that, as shown in FIG. 6, an electrode structure 003, which is the one in embodiment 2, is additionally arranged in the display area 01. Specifically, in the display area 01, a common electrode line 13 is arranged on the base substrate 11 and is used as the body electrode in the electrode structure 003, the passivation layer 10 is used as the first isolating layer in the electrode structure 003, the organic insulating layer 9 is used as the second isolating layer in the electrode structure 003, the gate insulating layer 8 is used as the third isolating layer in the electrode structure 003, the common electrode 12 is used as the introduction electrode in the electrode structure 003, and the introduction electrode is used for introducing a common reference voltage.

Other structures in the display area 01 of the array substrate are the same as the structures in the display area of embodiment 3, and are not repeated herein.

In the electrode structure 003 of this embodiment, the common electrode line 13 and the gate 71 are formed in the same layer by adopting the same material in the same patterning process. That is, the common electrode line 13 and the gate 71 are formed in the same layer of the array substrate. The base substrate 11 is equivalent to the first base substrate 1 of the electrode structure in embodiment 2 shown in FIG. 4. The introduction electrode and the common electrode 12 are formed by adopting the same material in the same patterning process. That is, the introduction electrode and the common electrode 12 are formed in the same layer of the array substrate, and the common electrode 12 also serves as the introduction electrode of the electrode structure 003.

It should be noted that, in the electrode structure 003, the common electrode 12 is served as the introduction electrode so as to be electrically connected with the common electrode line 13, so that the area of the common electrode 12 at the joint is increased and then the resistance of the common electrode 12 is reduced. There may be a plurality of electrode structures 003 in the display area 01, the plurality of electrode structures 003 are arranged at certain intervals, each electrode structure 003 corresponds to a common electrode line 13, and the introduction electrodes of the plurality of electrode structures 003 are electrically connected with each other. With such configuration, the resistance of the common electrodes 12 can be greatly reduced, so that the power consumption of the common electrodes 12 is greatly reduced, and the common reference voltage input to the common electrodes 12 is more uniform at the same time.

In this embodiment, the manufacturing steps of the electrode structure 003 in the array substrate are the same as those of the electrode structure in embodiment 2, and the manufacturing methods of other structures in the display area of the array substrate are the same as those in embodiment 3, which is not repeated herein.

Embodiment 4 has the beneficial effects that: the array substrate in embodiment 4 is provided with the electrode structure in the display area by adopting the solution of the present invention, so that when via holes are formed by the same one etching as the passivation layer and the gate insulating layer, the hole wall of the via hole which has been formed in the organic insulating layer is not damaged by etching, the electrode structure arranged in the display area may normally introduce the common reference voltage, meanwhile, the resistance of the common electrode is reduced, thus, the power consumption of the common electrode during displaying is reduced while the connection stability is ensured, and the displaying effect of the array substrate is improved.

Embodiment 5:

This embodiment provides a display device, including the array substrate of any of embodiments 3 and 4. By adopting the above-mentioned array substrate, the display device can be subjected to normal test, the test stability may be ensured, and the displaying effect of the display device can also be improved.

The display device may be any product or component with a display function, such as a liquid crystal panel, electronic paper, an OLED (organic light-emitting diode) panel, a mobile phone, a tablet computer, a television, a display, a notebook computer, a digital photo frame, a navigator, and so on.

The present invention has the beneficial effects that: according to the electrode structure provided by the present invention, the first isolating layer completely covers the hole wall of the second via hole in the second isolating layer, so that the hole wall of the second via hole in the second isolating layer will not be damaged, thus it is ensured that the introduction electrode can be electrically connected with the body electrode effectively, and that signals can be introduced normally. The array substrate adopting the electrode structure can normally introduce test signals and display signals via the electrode structure, so that the array substrate can be subjected to normal test and perform normal display, the test stability of the array substrate is improved, and the displaying effect of the array substrate is also improved. The display device adopting the array substrate can be subjected to normal test, and the displaying effect of the display device may be improved.

It could be understood that, the above embodiments are merely exemplary embodiments adopted for describing the principle of the present invention, rather than limiting the present invention. Various modifications and improvements may be made for those of ordinary skill in the art without departing from the spirit and essence of the present invention, and these modifications and improvements are regarded as within the protection scope of the present invention.

The invention claimed is:

1. An array substrate comprising a plurality of electrode structures, wherein each electrode structure comprises an introduction electrode and a body electrode, and a first isolating layer and a second isolating layer arranged between the introduction electrode and the body electrode, in which a first via hole is formed in the first isolating layer, a second via hole is formed in the second isolating layer, and a hole axis of the first via hole and a hole axis of the second via hole are on a same straight line passing through the body electrode, so that a part of the body electrode is exposed via the first via hole and the second via hole; and in which the introduction electrode is electrically connected with the body electrode through the part of the body electrode exposed via the first via hole and the second via hole, wherein a diameter of the first via hole is smaller than that of the second via hole, and the first isolating layer extends to completely cover the hole wall of the second via hole,
wherein the array substrate comprises a display area and a non-display area, the electrode structures are arranged in the non-display area and comprise a first electrode structure and a second electrode structure, and
wherein the introduction electrode in the first electrode structure is used for introducing a gate line test signal, and the introduction electrode in the second electrode structure is used for introducing a data line test signal.

2. The array substrate of claim 1, wherein a third isolating layer is arranged between the body electrode and the second isolating layer, a third via hole is formed in the third isolating layer, the hole axis of the third via hole and the hole axis of the second via hole are on the same straight line, and the diameter of the third via hole is smaller than or equal to that of the first via hole, so that the part of the body electrode is also exposed via the third via hole, and the first isolating layer also extends so as to cover the upper surface, exposed via the second via hole, of the third isolating layer.

3. The array substrate of claim 2, wherein the second isolating layer is formed by adopting a polyimide epoxy resin material, the first isolating layer and the third isolating layer are formed by adopting a silicon nitride material, and the introduction electrode is formed by adopting an indium tin oxide or indium-doped zinc oxide material.

4. The array substrate of claim 1, further comprising a base substrate, wherein the electrode structures are arranged on the base substrate.

5. The array substrate of claim 4, wherein a third isolating layer is arranged between the body electrode and the second isolating layer, a third via hole is formed in the third isolating layer, the hole axis of the third via hole and the hole axis of the second via hole are on the same straight line, and the diameter of the third via hole is smaller than or equal to that of the first via hole, so that the part of the body electrode is also exposed via the third via hole, and the first isolating layer also extends so as to cover the upper surface, exposed via the second via hole, of the third isolating layer.

6. The array substrate of claim 5, wherein the second isolating layer is formed by adopting a polyimide epoxy resin material, the first isolating layer and the third isolating layer are formed by adopting a silicon nitride material, and the introduction electrode is formed by adopting an indium tin oxide or indium-doped zinc oxide material.

7. The array substrate of claim 4, further comprising a plurality of gate lines and data lines crossed to each other, wherein the gate lines and the data lines divide the display area into a plurality of pixel regions; and a thin film transistor is arranged in each pixel region and comprises a gate, a gate insulating layer, a source and a drain, wherein the gate is electrically connected with one of the gate lines, the source is electrically connected with one of the data lines, an organic insulating layer and a passivation layer are arranged above the thin film transistor, a common electrode is arranged above the passivation layer, and the gate insulating layer, the organic insulating layer and the passivation layer simultaneously extend to the non-display area.

8. The array substrate of claim 7, wherein the gate line is electrically connected with the body electrode in the first electrode structure, the passivation layer extending to the non-display area is used as the first isolating layer in the first electrode structure, the organic insulating layer extending to the non-display area is used as the second isolating layer in the first electrode structure, the gate insulating layer extending to the non-display area is used as the third isolating layer in the first electrode structure; and
the data line is electrically connected with the body electrode in the second electrode structure, the passivation layer extending to the non-display area is used as the first isolating layer in the second electrode structure, the organic insulating layer extending to the non-display area is used as the second isolating layer in the second electrode structure.

9. The array substrate of claim 8, wherein the gate line and the body electrode in the first electrode structure are formed by adopting a same material in a same patterning process, and/or the data line and the body electrode in the second electrode structure are formed by adopting a same material in a same patterning process.

10. A manufacturing method of the electrode structure on the array substrate of claim 1, the method comprising the following steps:

forming a body electrode in an area corresponding to the non-display area on a first base substrate by a patterning process;

forming the second isolating layer on the first base substrate where the body electrode is formed, and forming a second via hole at a position corresponding to the body electrode in the second isolating layer by a patterning process;

forming the first isolating layer on the first base substrate where the body electrode and the second isolating layer are formed, and forming the first via hole in the first isolating layer by a patterning process, wherein the hole axis of the first via hole and the hole axis of the second via hole are on the same straight line, the diameter of the first via hole is smaller than that of the second via hole, so that a part of the body electrode is exposed via the first via hole and the second via hole, and the first isolating layer completely covers the hole wall of the second via hole; and forming the introduction electrode on the first base substrate where the body electrode, the second isolating layer and the first isolating layer are formed, wherein the introduction electrode is electrically connected with the body electrode through the part of the body electrode exposed via the first via hole and the second via hole, and the introduction electrode is used for introducing a gate line test signal or a data line test signal.

11. The manufacturing method of claim 10, wherein before the step of forming the second isolating layer, a third isolating layer is formed on the first base substrate where the body electrode is formed; and the step of forming the first via hole in the first isolating layer by the patterning process further comprises: forming a third via hole in the third isolating layer by the same patterning process as forming the first via hole, wherein the diameter of the third via hole is smaller than or equal to that of the first via hole, so that the part of the body electrode is also exposed via the third via hole, and the first isolating layer also completely covers the upper surface, exposed via the second via hole, of the third isolating layer.

12. An array substrate comprising a plurality of electrode structures, wherein each electrode structure comprises an introduction electrode and a body electrode, and a first isolating layer and a second isolating layer arranged between the introduction electrode and the body electrode, in which a first via hole is formed in the first isolating layer, a second via hole is formed in the second isolating layer, and a hole axis of the first via hole and a hole axis of the second via hole are on the same straight line passing through the body electrode, so that a part of the body electrode is exposed via the first via hole and the second via hole; and in which the introduction electrode is electrically connected with the body electrode through the part of the body electrode exposed via the first via hole and the second via hole, wherein the electrode structure, a diameter of the first via hole is smaller than that of the second via hole, and the first isolating layer extends to completely cover the hole wall of the second via hole, wherein the array substrate comprises a display area and a non-display area, the electrode structure is arranged in the display area as a third electrode structure, and the introduction electrode is used for introducing a common reference voltage.

13. The array substrate of claim 12, wherein a third isolating layer is arranged between the body electrode and the second isolating layer, a third via hole is formed in the third isolating layer, the hole axis of the third via hole and the hole axis of the second via hole are on the same straight line, and the diameter of the third via hole is smaller than or equal to that of the first via hole, so that the part of the body electrode is also exposed via the third via hole, and the first isolating layer also extends so as to cover the upper surface, exposed via the second via hole, of the third isolating layer.

14. The array substrate of claim 13, wherein the second isolating layer is formed by adopting a polyimide epoxy resin material, the first isolating layer and the third isolating layer are formed by adopting a silicon nitride material, and the introduction electrode is formed by adopting an indium tin oxide or indium-doped zinc oxide material.

15. The array substrate of claim 12, further comprising a base substrate, wherein the electrode structures are arranged on the base substrate.

16. The array substrate of claim 15, wherein a third isolating layer is arranged between the body electrode and the second isolating layer, a third via hole is formed in the third isolating layer, the hole axis of the third via hole and the hole axis of the second via hole are on the same straight line, and the diameter of the third via hole is smaller than or equal to that of the first via hole, so that the part of the body electrode is also exposed via the third via hole, and the first isolating layer also extends so as to cover the upper surface, exposed via the second via hole, of the third isolating layer.

17. The array substrate of claim 16, wherein the second isolating layer is formed by adopting a polyimide epoxy resin material, the first isolating layer and the third isolating layer are formed by adopting a silicon nitride material, and the introduction electrode is formed by adopting an indium tin oxide or indium-doped zinc oxide material.

18. The array substrate of claim 15, further comprising a plurality of gate lines and data lines crossed to each other, wherein the gate lines and the data lines divide the display area into a plurality of pixel regions; and a thin film transistor is arranged in each pixel region and comprises a gate, a gate insulating layer, a source and a drain, wherein the gate is electrically connected with one of the gate lines, the source is electrically connected with one of the data lines, an organic insulating layer and a passivation layer are arranged above the thin film transistor, a common electrode is arranged above the passivation layer, and the gate insulating layer, the organic insulating layer and the passivation layer simultaneously extend to the non-display area.

19. The array substrate of claim 18, wherein a common electrode line is arranged on the base substrate and is used as the body electrode in the third electrode structure, the passivation layer is used as the first isolating layer in the third electrode structure, the organic insulating layer is used as the second isolating layer in the third electrode structure, the gate insulating layer is used as the third isolating layer in the third electrode structure, the common electrode is used as the introduction electrode in the third electrode structure.

20. The array substrate of claim 19, wherein the common electrode line and the gate are formed by adopting a same material in a same patterning process; and the introduction electrode in the third electrode structure and the common electrode are formed by adopting a same material in a same patterning process.

21. A manufacturing method of the electrode structure on an array substrate of claim 12, the method comprising the following steps:

forming a body electrode in an area corresponding to the display area on a first base substrate by a patterning process;

forming the second isolating layer on the first base substrate where the body electrode is formed, and forming the second via hole at a position corresponding to the body electrode in the second isolating layer by a patterning process;

forming the first isolating layer on the first base substrate where the body electrode and the second isolating layer are formed, and forming the first via hole in the first isolating layer by a patterning process, wherein the hole axis of the first via hole and the hole axis of the second via hole are on the same straight line, the diameter of the first via hole is smaller than that of the second via hole, so that a part of the body electrode is exposed via the first via hole and the second via hole, and the first isolating layer completely covers the hole wall of the second via hole; and forming the introduction electrode on the first base substrate where the body electrode, the second isolating layer and the first isolating layer are formed, wherein the introduction electrode is electrically connected with the body electrode through the part of the body electrode exposed via the first via hole and the second via hole, and the introduction electrode is used for introducing a common reference voltage.

22. The manufacturing method of claim 21, wherein before the step of forming the second isolating layer, a third isolating layer is formed on the first base substrate where the body electrode is formed; and the step of forming the first via hole in the first isolating layer by the patterning process further comprises: forming a third via hole in the third isolating layer by the same patterning process as forming the first via hole, wherein the diameter of the third via hole is smaller than or equal to that of the first via hole, so that the part of the body electrode is also exposed via the third via hole, and the first isolating layer also completely covers the upper surface, exposed via the second via hole, of the third isolating layer.

* * * * *